United States Patent
Han et al.

(10) Patent No.: US 10,056,847 B2
(45) Date of Patent: Aug. 21, 2018

(54) HYBRID POWER CONVERSION SYSTEM AND METHOD OF DETERMINING EFFICIENCY USING THE SAME

(71) Applicant: SAMSUNG SDI CO., LTD., Yongin-si, Gyeonggi-do (KR)

(72) Inventors: Sangtaek Han, Yongin-si (KR); Stanislav Prykhodko, Yongin-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 459 days.

(21) Appl. No.: 14/739,213

(22) Filed: Jun. 15, 2015

(65) Prior Publication Data
US 2016/0211765 A1  Jul. 21, 2016

(30) Foreign Application Priority Data
Jan. 21, 2015 (KR) .................. 10-2015-0010021

(51) Int. Cl.
| | |
|---|---|
| *G01R 31/42* | (2006.01) |
| *H02M 7/42* | (2006.01) |
| *H02J 3/38* | (2006.01) |
| *H02M 7/48* | (2007.01) |
| *H02M 1/00* | (2006.01) |

(52) U.S. Cl.
CPC .............. *H02M 7/42* (2013.01); *G01R 31/42* (2013.01); *H02J 3/383* (2013.01); *H02M 7/48* (2013.01); *H02M 2001/007* (2013.01)

(58) Field of Classification Search
CPC ............................ H02M 7/42; H02M 2001/007
See application file for complete search history.

(56) References Cited

U.S. PATENT DOCUMENTS

| | | | | |
|---|---|---|---|---|
| 7,099,169 B2* | 8/2006 | West | .................. | H02M 7/5387 323/222 |
| 7,929,325 B2* | 4/2011 | de Rooij | ........... | H02M 7/53871 363/71 |
| 8,279,649 B2* | 10/2012 | Esram | ..................... | H02J 3/383 363/132 |
| 2005/0184713 A1* | 8/2005 | Xu | ........................ | H02M 3/156 323/282 |

(Continued)

FOREIGN PATENT DOCUMENTS

| | | |
|---|---|---|
| JP | 2005-137172 | 5/2005 |
| JP | 2013-005589 | 1/2013 |
| KR | 10-2013-0037054 A | 4/2013 |

*Primary Examiner* — Thienvu Tran
*Assistant Examiner* — Pinping Sun
(74) *Attorney, Agent, or Firm* — Lee & Morse, P.C.

(57) ABSTRACT

A hybrid power conversion system includes an inverter, a switching controller, and an efficiency measurer. The inverter is connected in series to a first converter and a second converter, and the first and second converters are respectively connected to first and second direct current power supplies. The switching controller controls switching frequencies of one or more switches in the first and second converters and the inverter. The efficiency measurer measures efficiency based on the switching frequencies. The switching controller determines the switching frequencies of the one or more switches as frequencies at which the system has a predetermined efficiency based on the efficiency measured by the efficiency measurer.

11 Claims, 6 Drawing Sheets

(56) References Cited

U.S. PATENT DOCUMENTS

| | | | |
|---|---|---|---|
| 2008/0174257 A1* | 7/2008 | Schnetzka | F25B 49/025 |
| | | | 318/434 |
| 2009/0323379 A1* | 12/2009 | de Rooij | H02M 7/53873 |
| | | | 363/97 |
| 2010/0052583 A1 | 3/2010 | Takamatsu et al. | |
| 2011/0144822 A1* | 6/2011 | Choi | H02J 3/32 |
| | | | 700/297 |
| 2012/0161539 A1* | 6/2012 | Kim | H02J 17/00 |
| | | | 307/104 |
| 2012/0187758 A1* | 7/2012 | Boskovitch | B60K 6/387 |
| | | | 307/10.1 |
| 2012/0281444 A1* | 11/2012 | Dent | H02M 7/53871 |
| | | | 363/56.01 |
| 2013/0107595 A1* | 5/2013 | Gautier | H02P 27/085 |
| | | | 363/124 |
| 2013/0187473 A1* | 7/2013 | Deboy | H02M 7/49 |
| | | | 307/82 |
| 2013/0200828 A1 | 8/2013 | Miller et al. | |
| 2014/0078799 A1* | 3/2014 | Erdman | H02M 7/53875 |
| | | | 363/97 |
| 2014/0321173 A1* | 10/2014 | Jones | H02J 3/383 |
| | | | 363/40 |
| 2014/0334190 A1* | 11/2014 | Zhang | H02M 3/33507 |
| | | | 363/17 |
| 2015/0372502 A1* | 12/2015 | Murayama | H02J 7/025 |
| | | | 307/104 |
| 2016/0043625 A1* | 2/2016 | Han | H02M 3/04 |
| | | | 363/65 |

* cited by examiner

HYBRID POWER CONVERSION SYSTEM AND METHOD OF DETERMINING EFFICIENCY USING THE SAME

CROSS-REFERENCE TO RELATED APPLICATION

Korean Patent Application No. 10-2015-0010021, filed on Jan. 21, 2015, and entitled, "Hybrid Power Conversion System and Method Of Determining Maximum Efficiency Using The Same," is incorporated by reference herein in its entirety.

BACKGROUND

1. Field

One or more embodiments described herein relate to a hybrid power conversion system and a method for determining efficiency with a hybrid power conversion system.

2. Description of the Related Art

A variety of techniques have been developed for transferring solar light energy to an energy source (e.g., a grid or battery) or a load. One technique involves uses a photovoltaic power conversion system (PVPCS) for this purpose. However, a PVPCS has a unidirectional shape for only transferring photovoltaic (PV) energy to the grid or load. Such a PVPCS has limited functionality.

In order to supply large-capacity power, a power conversion system (PCS) may be connected to a plurality of power supplies in parallel. For example, a PCS may connect a plurality of generation modules in parallel that produce power from renewable energy. The generation modules may supply power to the load or grid. According to another approach, a PCS may connect a plurality of batteries in parallel, and the batteries may supply power to the load or grid.

A PCS may include a DC/DC converter that boosts or drops direct current (DC) power, and an inverter that converts DC power to alternating current (AC) power. Such a PCS may also control output power according to switching operations of switches in the converter and the inverter.

SUMMARY

In accordance with one or more embodiments, a hybrid power conversion system includes a first direct current (DC) power supply; a first converter connected to the first DC power supply; a second DC power supply connected in parallel to the first DC power supply; a second converter connected to the second DC power supply; an inverter connected in series to each of the first converter and the second converter; a switching controller to control switching frequencies of one or more switches in the first and second converters and the inverter; and an efficiency measurer to measure efficiency based on the switching frequencies, wherein the switching controller is to determine the switching frequencies of the one or more switches as frequencies at which the system has a predetermined efficiency based on the efficiency measured by the efficiency measurer.

The first converter may include a first switch connected in parallel to the first DC power supply and connected in series to the inverter. The second converter may include a second switch connected in parallel to the second DC power supply and a third switch connected in series to the second DC power supply, and the second DC power supply may include or may be coupled to a chargeable battery and is connected in series to the inverter. The inverter may include fourth through seventh switches to convert DC power from the first DC power supply or the second DC power supply to alternating current (AC).

The system may include a memory to store efficiency information of the hybrid power conversion system corresponding to the switching frequencies from the efficiency measurer, wherein the switching controller is to select switching frequencies at which the system has the predetermined efficiency based on the information stored in the memory.

The switching controller may change a switching frequency of the first switch, the efficiency measurer may measure a first efficiency from power at an input terminal of the first converter and power at an output terminal of the inverter, and the switching controller may determine a switching frequency at which the first efficiency is in a predetermined state as the switching frequency of the first switch.

The switching controller may change switching frequencies of the fourth through seventh switches, the efficiency measurer may measure a second efficiency from the power at the input terminal of the first converter and the power at the output terminal of the inverter, and the switching controller may determine a switching frequency at which the second efficiency is in a predetermined state as the switching frequencies of the fourth through seventh switches, wherein the switching frequency of the first switch is a switching frequency at which the first efficiency is in the predetermined state.

The switching controller may change switching frequencies of the second and third switches, the efficiency measurer may measure third efficiency from power at an input terminal of the second converter and power at an output terminal of the inverter, and the switching controller may determine a switching frequency at which the third efficiency is in a predetermined state as the switching frequencies of the second and third switches, wherein the switching frequencies of the first and fourth through seventh switches are switching frequencies at which the first and second efficiencies are in respective predetermined states.

The system may include a third DC power supply connected in parallel to the first and second DC power supplies in parallel and connected in series to the inverter; and a third converter connected between the third DC power supply and the inverter. The switching controller may periodically change the switching frequencies of the first to seventh switches, and determine switching frequencies at which the first through third efficiencies are in a predetermined state based on the efficiency measured by the efficiency measurer. Each of the switches may include an insulated gate bipolar transistors.

In accordance with one or more other embodiments, a method determines the efficiency of a hybrid power conversion system, which includes a first switch connected in parallel to a first DC power supply and connected in series to an inverter, a second switch connected in parallel to a second DC power supply, a third switch connected in series to the second DC power supply, and fourth through seventh switches to convert DC power from the first DC power supply or the second DC power supply to alternating current (AC).

The method includes determining a switching frequency of a first converter, the switching frequency of the first converter corresponding to a switching frequency of the first switch at which the system has a predetermined efficiency when switching frequencies of the second through seventh switches are fixed; determining a switching frequency of the inverter, the switching frequency of the inverter corresponding to switching frequencies of the fourth through seventh switches at which the system has the predetermined efficiency when the first converter switching frequency is fixed; and determining a switching frequency of a second converter, the switching frequency of the second converter corresponding to switching frequencies of the second and third switches at which the system has the predetermined efficiency when the first converter switching frequency and the inverter switching frequency are fixed, Determining the switching frequency of the first converter may include determining the predetermined efficiency of the system based on efficiency measured from power at an input terminal of the first converter and power at an output terminal of the inverter, and determining the switching frequency of the first converter corresponding to the predetermined efficiency.

Determining the switching frequency of the inverter may include determining maximum efficiency of the system based on an efficiency measured from the power at the input terminal of the first converter and the power at the output terminal of the inverter and determining the inverter switching frequency corresponding to the maximum efficiency.

Determining the switching frequency of the second converter may include determining the predetermined efficiency of the system based on an efficiency measured from power at an input terminal of the second converter and power at the output terminal of the inverter, and determining the switching frequency of the second converter corresponding to the predetermined efficiency.

Determining the switching frequency of the first converter may include changing the switching frequency of the first switch at predetermined time intervals, storing efficiency information of the system corresponding to the switching frequency at each of the predetermined time intervals, and determining a switching frequency corresponding to the predetermined efficiency of the system as the first converter switching frequency based on the efficiency information.

Determining the switching frequency of the inverter may include changing the switching frequencies of the fourth through seventh switches at predetermined time intervals, storing efficiency information of the system corresponding to the switching frequency at each of the predetermined time intervals, and determining a switching frequency corresponding to the predetermined efficiency of the system as the switching frequency of the inverter based on the efficiency information.

Determining the switching frequency of the second converter may include changing the switching frequencies of the second and third switches at predetermined time intervals, storing efficiency information of the system corresponding to the switching frequency at each of the predetermined time intervals, and determining the switching frequency corresponding to the predetermined efficiency of the system as the switching frequency of the second converter based on the efficiency information.

Determining the switching frequency of the first converter, determining of the switching frequency of the inverter, and determining of switching frequency of the second converter may be periodically performed.

In accordance with one or more other embodiments, an apparatus includes a switching controller to control switching frequencies of one or more switches in a first converter and a second converter and an inverter and an efficiency measurer to measure efficiency based on the switching frequencies, wherein the switching controller is to determine the switching frequencies of the one or more switches as frequencies at which a hybrid power conversion system has a predetermined efficiency based on the efficiency measured by the efficiency measurer, wherein the inverter is coupled in series with each of the first and second converters and wherein a first direct current power supply is connected to the first converter and a second DC power supply is connected to the second converter.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
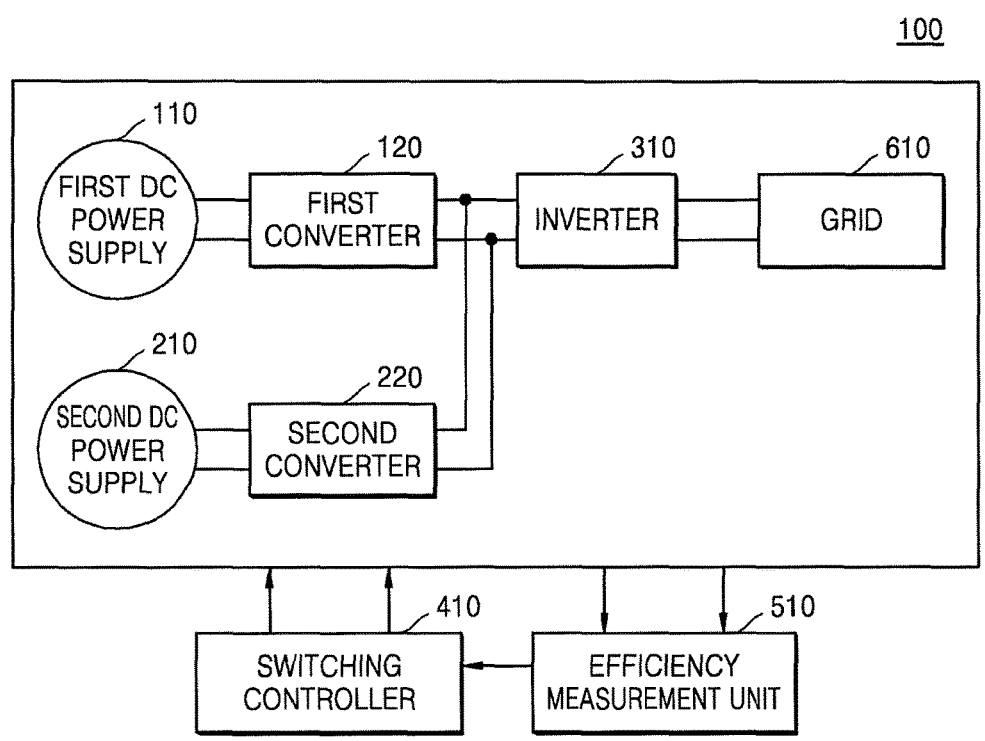
FIG. 1 illustrates an embodiment of a hybrid power conversion system.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. Embodiments may be combined to form additional embodiments. Like reference numerals refer to like elements throughout.

It will be understood that when a component is referred to as being "connected to," or "linked to," another component, it can be directly or indirectly connected to or linked to the other component. However, it will be understood that intervening components may be present. On the other hand, it will be understood that when a component is referred to as being "directly connected to," or "directly linked to," another component, intervening components may be present. Other expressions for describing the relationship between components, such as "between ~," "immediately between ~," or "directly adjacent to ~," should be interpreted in like manner.

FIG. 1 illustrates an embodiment of a hybrid power conversion system 100 which is a power conversion system (PCS) that includes first and second direct current (DC) power supplies 110 and 210, at least one converter, and an inverter 310. In one embodiment the at least one converter includes first and second converters 120 and 220.

The hybrid power conversion system 100 further includes a switching controller 410 and an efficiency measurement unit 510. The inverter 310 is connected to the first and second converters 120 and 220 in series. The first and second DC power supplies 110 and 210 are connected to each other in parallel. The first and second converters 120 and 220 may be DC/DC converters that produce direct currents of different levels by changing levels of direct currents produced by the first and second DC power supplies 110 and 210. The first and second converters 120 and 220 are respectively connected to the first and second DC power supplies 110 and 210 in series. Thus, the first and second converters 120 and 220 are connected to each other in parallel.

The inverter 310 converts a direct current produced by the first or second DC power supply 110 or 210 to an alternating current and supplies the converted current to a grid. In FIG. 1, the inverter 310 is connected to the grid. In another embodiment, a load may be connected to the inverter 310 and the inverter 310 may supply AC power to the load.

The switching controller 410 controls switching frequencies of one or more switches in the first and second converters 120 and 220 and inverter 310, respectively. In one embodiment, each of the first and second converters 120 and 220 and the inverter 310 includes one or more switches, and the first converter 120 receives DC power from the first DC power supply 110 and the second converter 220 receives DC power from the second DC power supply 210.

The first and second converters 120 and 220 may adjust boosting ratios of output voltages according to switching operations of the switches, and magnitudes of output voltages are determined accordingly.

The inverter 310 receives the DC power from the first converter 120 and/or the second converter 220. The inverter 310 converts the DC power into AC power so that the supplied power may be have a predetermined voltage, a predetermined current, a predetermined phase, and a predetermined frequency. The inverter 310 causes the output power to be the same as the AC power of the grid according to the switching operations of the switches.

The switching controller 410 controls switching frequencies of one or more switches in the first and second converters 120 and 220 and the inverter 310, respectively, thereby controlling the switching operations of one or more switches and causing power output from the first and second converters 120 and 220 and the inverter 310 to have desired characteristics.

The efficiency measurement unit 510 measures efficiency according to the switching frequencies. For example, the efficiency measurement unit 510 measures efficiency of the hybrid power conversion system 100 from the power produced by the first DC power supply 110 or the second DC power supply 210 and output from the inverter 310.

The efficiency measurement unit 510 may include a current measurement device and a voltage measurement device that may respectively measure a current and a voltage at both terminals of the first and second converters 120 and 220 and the inverter 310, in order to measure the efficiency of the hybrid power conversion system 100.

The efficiency of the hybrid power conversion system 100 may vary according to the switching frequencies. The efficiency measurement unit 510 measures the switching frequencies at an efficiency measurement time and the efficiency of the hybrid power conversion system 100 at the measurement time.

The switching controller 410 determines the switching frequencies of the switches as frequencies at which the hybrid power conversion system 100 has a predetermined (e.g., maximum or another) efficiency, taking into account efficiency measured by the efficiency measurement unit 510.

Various parameters of an output terminal of the first or second converter 120 or 220 or the inverter 310 may vary according to the switching operations of the switches in the first and second converters 120 and 220 and the inverter 310. The various parameters may be factors for indicating characteristics of power output from the first or second converter 120 or 220 or the inverter 310. For example, the various parameters may be a magnitude or phase of an output voltage or output current.

The inverter 310 may include a plurality of switches, may output AC power having particular characteristics according to switching operations of the switches, and may output the AC power to a voltage having a desired magnitude, for example, by adjusting duty ratios of the switches.

The switching controller 410 may control switching frequencies (e.g., carrier frequencies) of the plurality of switches, and the switches in the first and second converters 120 and 220. The duty ratios of the switches may be fixed, for example, as predetermined values.

Figure 2:
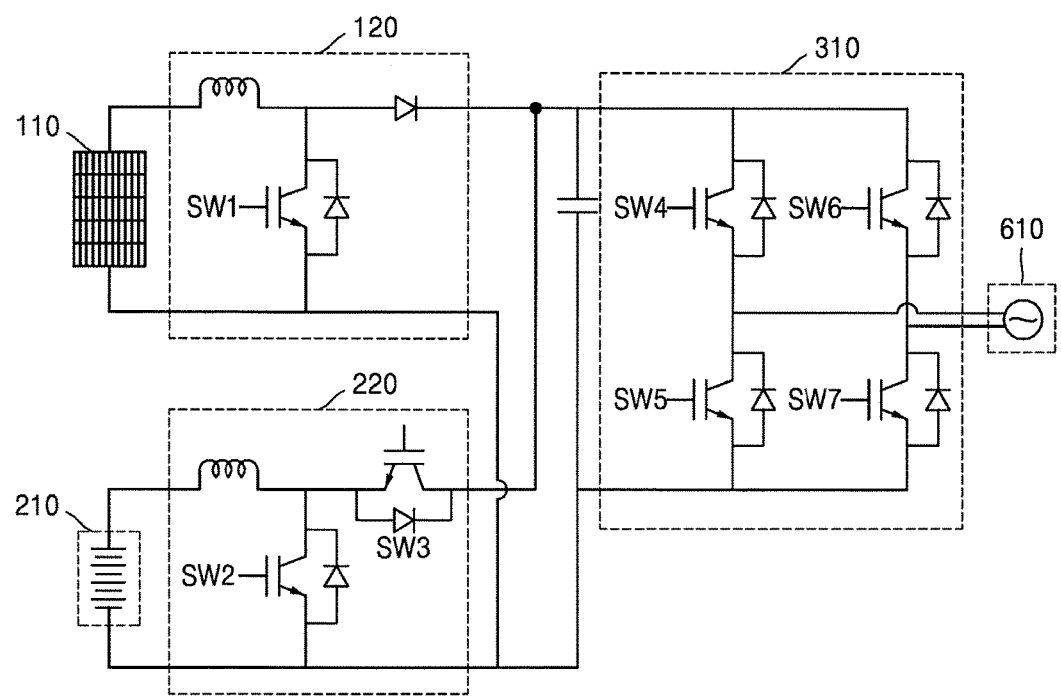
FIG. 2 illustrates a circuit embodiment of the hybrid power conversion system.

FIG. 2 illustrates a circuit embodiment of the hybrid power conversion system 100. The circuits in FIG. 2 correspond to the first and second DC power supplies 110 and 210, the first and second converters 120 and 220, and the inverter 310 of the hybrid power conversion system 100.

Referring to FIG. 2, the first DC power supply 110 may be a solar light generation module and the second DC power supply 210 may be a chargeable/dischargeable battery. In another embodiment, the first DC power supply 110 may be a power supply that supplies DC power such as a wind power generation module or a fuel cell. The second DC power supply 210 may be, for example, a lithium-ion cell or a nickel-cadmium cell.

The first converter 120 may include a first switch SW1 which is connected to the first DC power supply 110 in parallel and is connected to the inverter 310 in series. The first converter 120 may include a coil and a diode that are connected to the first DC power supply 110 in series.

The second converter 220 may include a second switch SW2 connected to the second DC power supply 210 in parallel and a third switch SW3 connected to the second DC power supply 210 in series and is connected to the inverter 310 in series. Also, the second converter 220 may include a coil connected between the second DC power supply 210 and the third switch SW3 in series.

The coils in the first and second converters 120 and 220 cause power produced by the first and second DC power supplies 110 and 210 to be output as power having a higher level according to operations of the first, second, and third switches SW1, SW2, and SW3. The diode prevents the AC power flowing through the grid from being supplied to the first DC power supply 110 via the inverter 310.

On the other hand, the second converter 220 may cause the power supplied from the grid via the third switch SW3 to be charged in the second DC power supply 210.

The inverter 310 may include fourth through seventh switches SW4 through SW7 for converting the DC power supplied from the first DC power supply 110 or the second DC power supply 210 into AC power. The inverter 310 may be a full bridge inverter including the fourth through seventh switches SW4 through SW7 and may further include a filtering circuit including, for example, a coil and a capacitor between the inverter 310 and a grid 610.

An output voltage, a current, a phase, and a frequency of output power are adjusted according to switching operations of the fourth through seventh switches SW4 through SW7 of the inverter 310.

The switching controller 410, described with reference to FIG. 1, controls switching frequencies of the first through seventh switches SW1 through SW7. The efficiency measurement unit 510 measures efficiency of the hybrid power conversion system 100 according to the switching frequencies.

The switching controller 410 determines switching frequencies at which the hybrid power conversion system 100 has a predetermined (e.g., maximum or another) efficiency based on efficiency measured by the efficiency measurement unit 510. Also, the switching controller 410 may control the switching frequencies of the first through seventh switches SW1 through SW7.

The first through seventh switches SW1 through SW7 may be, for example, insulated gate bipolar transistors (IGBTs) or switches that may perform switching operations in response to switching control signals.

Capacitors connected to the first and second converters 120 and 220 and the inverter 310 in parallel, respectively, form a DC link. The capacitors receive power from the first and second DC power supplies 110 and 210 from the first and second converters 120 and 220 and convert the power into a DC link voltage.

Figure 3:
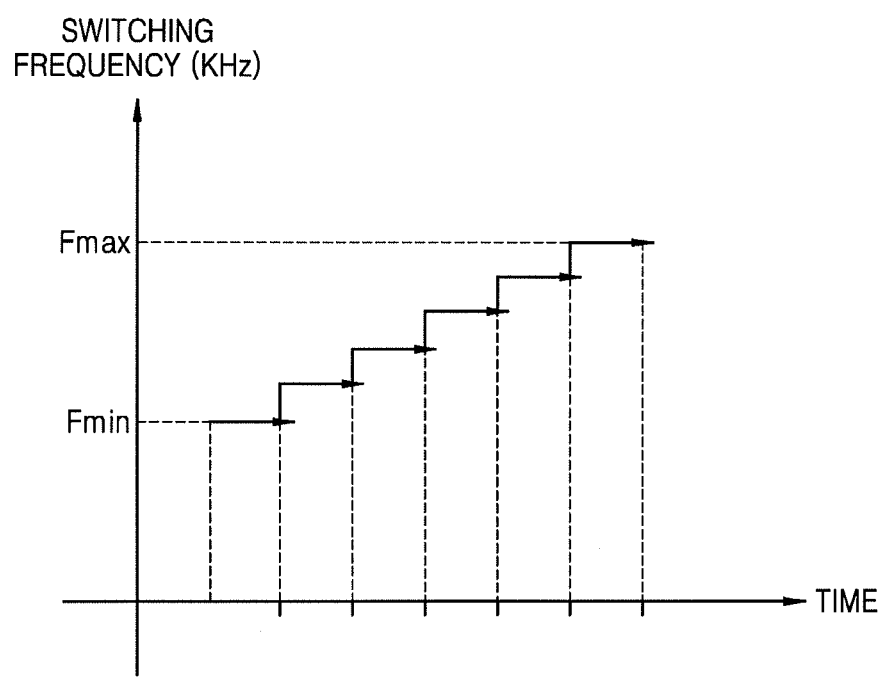
FIG. 3 illustrates an embodiment for determining switching frequency.

FIG. 3 illustrates an embodiment of an operation for determining a switching frequency. According to this embodiment, the switching controller 410 controls switching frequencies of the first through seventh switches SW1 through SW7 from a minimum frequency Fmin to a maximum frequency Fmax. The switching controller 410 may sequentially change the switching frequencies from the minimum frequency Fmin to the maximum frequency Fmax at regular intervals and vice versa.

The efficiency measurement unit 510 measures the efficiency of the hybrid power conversion system 100 corresponding to the switching frequencies changed by the switching controller 410. The efficiency measurement unit 510 may measure the efficiency of the hybrid power conversion system 100 and store the measured information in a predetermined format, e.g., (frequency, efficiency).

The efficiency measurement unit 510 may include or be coupled to a memory unit for storing the measured efficiency information. The switching controller 410 may select the switching frequencies at which the hybrid power conversion system 100 has a predetermined (e.g., maximum) efficiency based on the efficiency information stored in the memory unit.

Figure 4:
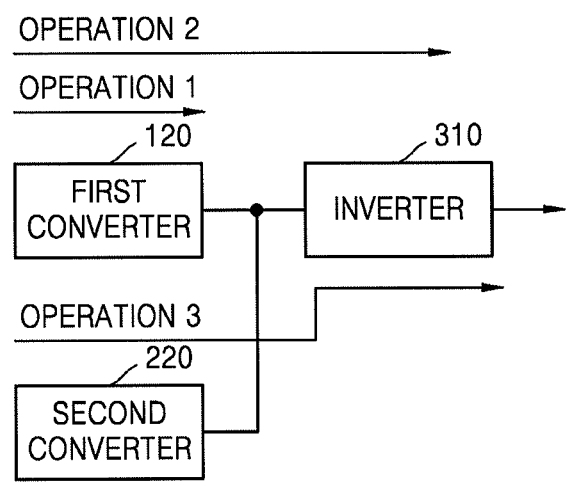
FIG. 4 illustrates an order for determining a switching frequency.

FIG. 4 illustrates an embodiment of an order for determining switching frequency. The embodiment of FIG. 4 corresponds to a system including two DC/DC converters and the inverter 310 described with reference to FIGS. 1 and 2.

First, the switching controller 410 changes a switching frequency of the first switch SW1, and the efficiency measurement unit 510 measures first efficiency from power at an input terminal of the first converter 120 and power at an output terminal of the inverter 310 (OPERATION 1).

The switching controller 410 determines a switching frequency at which the first efficiency is in a predetermined (e.g., maximum) state as the switching frequency of the first switch SW1. In this case, switching frequencies of the fourth through seventh switches SW4 through SW7 in the inverter 310 are fixed as predetermined values. The switching controller 410 determines a switching frequency of the first switch SW1 at which the first efficiency is in the predetermined (e.g., maximum) state based on only the switching frequency of the first switch SW1 and the efficiency information of the hybrid power conversion system 100 caused by the switching frequency of first switch SW1.

Next, first, the switching controller 410 changes switching frequencies of the fourth through seventh switches SW4 through SW7, and the efficiency measurement unit 510 measures second efficiency from the power at the input terminal of the first converter 120 and the power at the output terminal of the inverter 310 (OPERATION 2).

The switching controller 410 determines a switching frequency at which the second efficiency is in a predetermined (e.g., maximum) state, as the switching frequencies of the fourth through seventh switches SW4 through SW7. In this case, the switching frequency of the first switch SW1 is fixed as the previously-determined value. The switching controller 410 determines switching frequencies of the fourth through seventh switches SW4 through SW7 at which the second efficiency is in the predetermined (e.g., maximum) state based on only the switching frequencies of the fourth through seventh switches SW4 through SW7 and the efficiency information of the hybrid power conversion system 100 caused by the switching frequencies of the fourth through seventh switches SW4 through SW7.

Next, the switching controller 410 determines switching frequencies of the second and third switches SW2 and SW3 (OPERATION 3). The switching controller 410 changes the switching frequencies of the second and third switches SW2 and SW3. The efficiency measurement unit 510 measures third efficiency from the power at the input terminal of the second converter 220 and the power at the output terminal of the inverter 310.

The switching controller 410 determines a switching frequency at which the third efficiency is in a predetermined (e.g., maximum) state, as the switching frequencies of the second and third switches SW2 and SW3. In this case, the switching frequencies of the first and fourth through seventh switches SW1 and SW4 through SW7 are fixed as the previously-determined values. The switching controller 410 determines switching frequencies of the second and third switches SW2 and SW3 at which the third efficiency is in the predetermined (e.g., maximum) state based on only the switching frequencies of the second and third switches SW2 and SW3 and the efficiency information of the hybrid power conversion system 100 caused by the switching frequencies of the second and third switches SW2 and SW3.

The switching controller 410 first determines a switching frequency of a switch in the first converter 120, and then determines a switching frequency of a switch in the inverter 310. Next, the switching controller 410 determines a switching frequency of a switch in the second converter 220.

In this embodiment, the hybrid power conversion system 100 may further include a DC power supply different from the first and second DC power supplies 110 and 210. For example, the hybrid power conversion system 100 may include a third DC power supply that is connected to the first and second DC power supplies 110 and 210 in parallel and connected to the inverter 310 in series. The third DC power supply may include a third converter connected between the third DC power supply and inverter 310.

In this case, operation of the switching controller 410 may be performed in the order of determining a switching frequency of the switch in the first converter 120, a switching frequency of the switch in the inverter 310, a switching frequency of the switch in the second converter 220 and then, a switching frequency of the switch in the third converter.

The switching controller 410 periodically changes the switching frequencies of the first through seventh switches SW1 through SW7, and may determine a switching frequency at which the first through third efficiencies are in a predetermined (e.g., maximum) state based on efficiency measured by the efficiency measurement unit 510.

The performance of the first through seventh switches SW1 through SW7 in the first and second converters 120 and

220 and the inverter 310 may be lowered or changed, for example, based on usage time accumulation and particular temperature conditions. Alternatively, switching frequencies of the first through seventh switches SW1 through SW7 may be differently set in preparation for a change of a situation. e.g., derating.

When the same switching frequency is used in spite of the performance change or environment change, the efficiency of the hybrid power conversion system 100 may be lowered. The switching controller 410 may change the switching frequencies of the first through seventh switches SW1 through SW7 so that the hybrid power conversion system 100 may operate with predetermined (e.g., maximum) efficiency even though usage times are accumulated. The efficiency measurement unit 510 may measure the efficiency of the hybrid power conversion system 100 according to the changed switching frequencies.

The switching controller 410 may change the switching frequencies of the first through seventh switches SW1 through SW7 according to the newly measured efficiency of the hybrid power conversion system 100.

Figure 5:
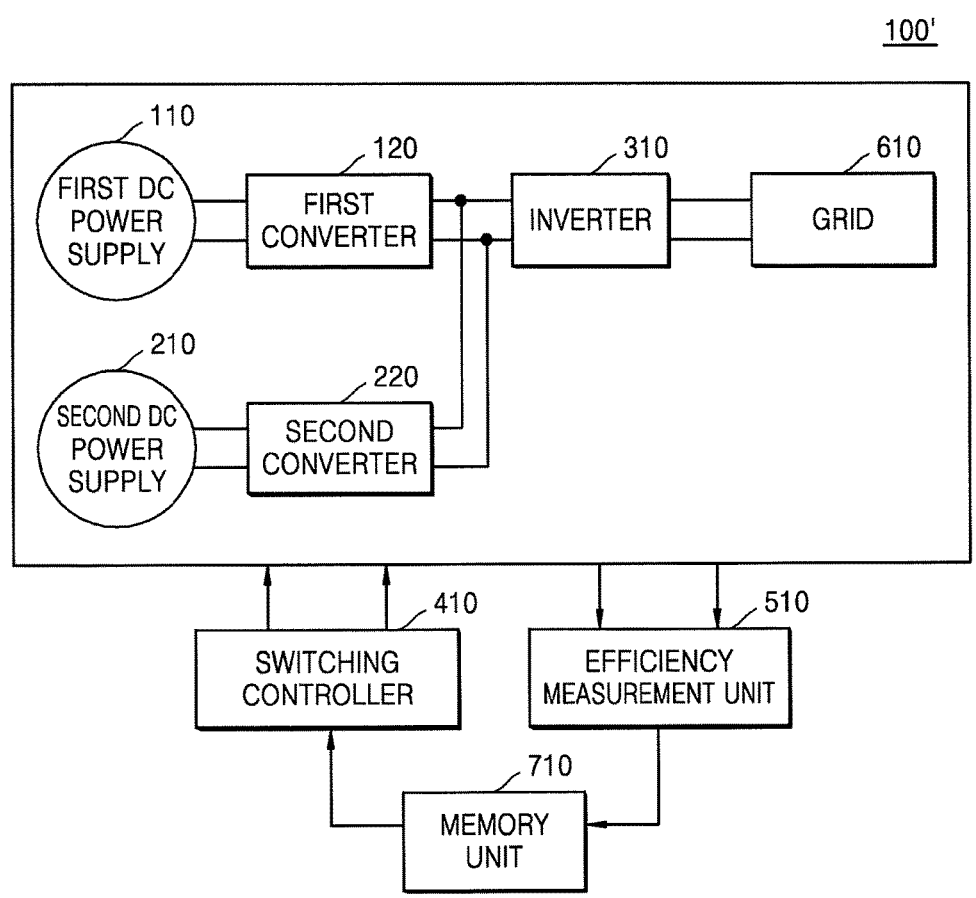
FIG. 5 illustrates another embodiment of a hybrid power conversion system.

FIG. 5 illustrates another embodiment of a hybrid power conversion system 100' which has a memory unit 710 in the hybrid power conversion system 100 of FIG. 1. The memory unit 710 stores efficiency information of the hybrid power conversion system 100' corresponding to the switching frequency from the efficiency measurement unit 510. The switching controller 410 may select switching frequencies at which the hybrid power conversion system 100' has predetermined (e.g., maximum) efficiency based on the information stored in the memory unit 710.

The memory unit 710 stores efficiency information of the hybrid power conversion system 100' corresponding to the switching frequencies from the efficiency measurement unit 510. The switching controller 410 may select switching frequencies at which the hybrid power conversion system 100' has predetermined (e.g., maximum) efficiency based on the information stored in the memory unit 710.

The efficiency measurement unit 510 may store the efficiency of the hybrid power conversion system 100' based on the switching frequency in a predetermined format, e.g., (frequency, efficiency), in the memory unit 710, and may store the efficiency of the hybrid power conversion system 100' in a predetermined format, e.g., (frequency, first efficiency information), (frequency, second efficiency information), or (frequency, third efficiency information) according to the order of determining switching frequencies of the first through seventh switches SW1 through SW7.

The switching controller 410 may determine switching frequencies of the first through seventh switches SW1 through SW7 based on the first through third efficiency information stored in the memory unit 710.

Figure 6:
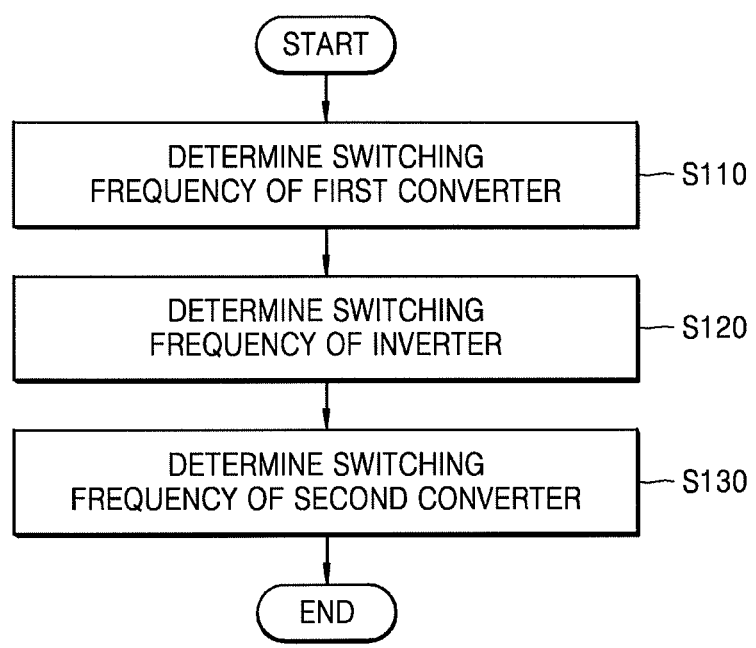
FIG. 6 illustrates an embodiment of a method for determining maximum efficiency for a hybrid power conversion system.

FIG. 6 illustrates an embodiment of a method for determining predetermined efficiency, which, for example, may be maximum efficiency. The method may be implemented using, for example, hybrid power conversion system 100 or 100'. The method includes determining a first converter switching frequency (S110), determining an inverter switching frequency (S120), and determining a second converter switching frequency (S130).

The first converter switching frequency, the inverter switching frequency, and the second converter switching frequency refer to switching frequencies of switches in the first converter 120, the inverter 310, and the second converter 220, respectively. Thus, the first converter switching frequency refers to a switching frequency of the first switch SW1. The inverter switching frequency refers to switching frequencies of the fourth through seventh switches SW4 through SW7. The second converter switching frequency refers to switching frequencies of second and third switches SW2 and SW3.

In determining the first converter switching frequency (S110), the first converter switching frequency is a switching frequency of the first switch SW1 at which the hybrid power conversion system 100 or 100' has a predetermined (e.g., maximum) efficiency, in a state in which the switching frequencies of the second through seventh switches SW2 through SW7 of the hybrid power conversion system 100 or 100' are fixed.

In this case, the efficiency of the hybrid power conversion system 100 or 100' may be determined based on efficiency measured from the power at the input terminal of the first converter 120 and the power at the output terminal of the inverter 310. Then, the first converter switching frequency corresponding to the predetermined (e.g., maximum) efficiency of the measured efficiency may be determined.

In determining the inverter switching frequency (S120), the inverter switching frequency is determined to correspond to the switching frequencies of the fourth through seventh switches SW4 through SW7 at which the hybrid power conversion system 100 or 100' has the predetermined (e.g., maximum) efficiency, in a state in which the first converter switching frequency is fixed.

The first converter switching frequency is the switching frequency determined in the determining of the first switching frequency (S110). In this case, the efficiency of the hybrid power conversion system 100 or 100' may be determined from efficiency measured from the power at the input terminal of the first converter 120 and the power at the output terminal of the inverter 310, and the inverter switching frequency corresponding to maximum efficiency of the measured efficiency may be determined.

In determining of the second converter switching frequency (S130), the second converter switching frequency is determined to correspond to the switching frequencies of the second and third switches SW2 and SW3 at which the hybrid power conversion system 100 or 100' has predetermined (e.g., maximum) efficiency, in a state in which the first converter switching frequency and the inverter switching frequency are fixed.

The first converter switching frequency and the inverter switching frequency are the switching frequencies determined in the determining of the first converter switching frequency (S110) and determining of the inverter switching frequency (S120). In this case, the efficiency of the hybrid power conversion system 100 or 100' may be determined based on efficiency measured from the power at the input terminal of the second converter 220 and the power at the output terminal of the inverter 310, and the second converter switching frequency corresponding to maximum efficiency of the measured efficiency may be determined.

In determining of the first converter switching frequency (S110), determining of the inverter switching frequency (S120), and determining of the second converter switching frequency (S130), the switching frequencies of the first switch SW1, the fourth through seventh switches SW4 through SW7, and the second and third switches SW2 and SW3 may be changed at predetermined time intervals.

Efficiency information of the hybrid power conversion system 100 or 100' corresponding to each switching frequency may be stored. A switching frequency corresponding to maximum efficiency of the hybrid power conversion system 100 or 100' is determined as the first converter switching frequency, the inverter switching frequency, and the second converter switching frequency based on the stored efficiency information.

Determining of the first converter switching frequency (S110), determining of the inverter switching frequency (S120), and determining of the second converter switching frequency (S130) may be periodically performed. Thus, the efficiency of the entire power conversion system may be prevented from being lowered due to a shortened lifespan of the switches.

As described above, according to the one or more of the above exemplary embodiments, a hybrid power conversion system may operate with a predetermined or maximum efficiency in a power conversion system (PCS) including a bi-directional converter and a bi-directional inverter. Also, a method for determining a predetermined or maximum efficiency using such a system is provided.

The controllers, measurement units, and other processing features of the embodiments disclosed herein may be implemented in logic which, for example, may include hardware, software, or both. When implemented at least partially in hardware, the controllers, measurement units, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, measurement units, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments described herein.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A hybrid power conversion system, comprising:
a first direct current (DC) power supply;
a first converter connected to the first DC power supply;
a second DC power supply connected in parallel to the first DC power supply;
a second converter connected to the second DC power supply;
an inverter connected in series to each of the first converter and the second converter;
a switching controller to control switching frequencies of one or more switches in each of the first and second converters and the inverter; and
an efficiency measurer to measure efficiency based on the switching frequencies, wherein the switching controller is to determine the switching frequencies of the one or more switches in each of the first and second converters and the inverter based on the efficiency measured by the efficiency measurer in order to achieve a predetermined efficiency, wherein:
the switching controller is to change switching frequencies of the one or more switches in the inverter, the efficiency measurer is to measure a second efficiency from power at an input terminal of the first converter and power at an output terminal of the inverter, and the switching controller is to determine a switching frequency at which the second efficiency is in a predetermined state as the switching frequencies of the one or more switches in the inverter,
the switching frequency of a first switch in the first converter is a switching frequency at which a first efficiency is in the predetermined state, and
the efficiency measurer is to measure the first efficiency from the power at the input terminal of the first converter and the power at the output terminal of the inverter while the switching controller is changing the switching frequency of the first switch in the first converter.

2. The system as claimed in claim 1, wherein the first switch is connected in parallel to the first DC power supply and connected in series to the inverter.

3. The system as claimed in claim 1, wherein the second converter includes:
a second switch connected in parallel to the second DC power supply and a third switch connected in series to the second DC power supply, and
the second DC power supply includes or is connected to a chargeable battery and is connected in series to the inverter.

4. The system as claimed in claim 1, wherein the inverter includes:
fourth through seventh switches to convert DC power from the first DC power supply or the second DC power supply to alternating current (AC).

5. The system as claimed in claim 1, further comprising:
a memory to store efficiency information of the hybrid power conversion system corresponding to the switching frequencies from the efficiency measurer, wherein the switching controller is to select switching frequencies at which the system has the predetermined efficiency based on the information stored in the memory.

6. The system as claimed in claim 1, wherein:
the switching controller is to change switching frequencies of the second and third switches, the efficiency measurer is to measure a third efficiency from power at an input terminal of the second converter and the power at the output terminal of the inverter, and
the switching controller is to determine a switching frequency at which the third efficiency is in a predetermined state as the switching frequencies of the second and third switches, wherein the switching frequencies of the first and fourth through seventh switches are switching frequencies at which the first and second efficiencies are in the respective predetermined states.

7. The system as claimed in claim 6, wherein the switching controller is to:
periodically change the switching frequencies of the first to seventh switches, and
determine switching frequencies at which the first through third efficiencies are in a predetermined state based on the efficiency measured by the efficiency measurer.

8. The system as claimed in claim 1, further comprising:
a third DC power supply connected in parallel to the first and second DC power supplies in parallel and connected in series to the inverter; and
a third converter connected between the third DC power supply and the inverter.

9. The system as claimed in claim 1, wherein each of the switches includes an insulated gate bipolar transistors.

10. An apparatus, comprising:
a switching controller to control switching frequencies of one or more switches in each of a first converter and a second converter and an inverter; and
an efficiency measurer to measure efficiency based on the switching frequencies,
wherein the switching controller is to determine the switching frequencies of the one or more switches in each of the first converter and the second converter and the inverter as frequencies at which a hybrid power conversion system has a predetermined efficiency based on the efficiency measured by the efficiency measurer, wherein the inverter is coupled in series with each of the first and second converters and wherein a first direct current power supply is connected to the first converter and a second DC power supply is connected to the second converter, wherein:
the switching controller is to change switching frequencies of the one or more switches in the inverter, the efficiency measurer is to measure a second efficiency from power at an input terminal of the first converter and power at an output terminal of the inverter, and the switching controller is to determine a switching frequency at which the second efficiency is in a predetermined state as the switching frequencies of the one or more switches in the inverter,
the switching frequency of a switch in the first converter is a switching frequency at which a first efficiency is in the predetermined state, and
the efficiency measurer is to measure the first efficiency from the power at the input terminal of the first converter and the power at the output terminal of the inverter while the switching controller is changing the switching frequency of the switch in the first converter.

11. The system as claimed in claim 1, wherein the predetermined efficiency is a maximum efficiency.

* * * * *